(12) United States Patent
Yamamoto et al.

(10) Patent No.: US 7,583,215 B2
(45) Date of Patent: Sep. 1, 2009

(54) SEMICONDUCTOR INTEGRATED CIRCUIT

(75) Inventors: Takaya Yamamoto, Tokyo (JP); Tatsuji Matsuura, Tokyo (JP); Masumi Kasahara, Tokyo (JP); Hideo Nakane, Tokyo (JP); Junya Kudo, Tokyo (JP); Yoshitaka Jingu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/013,855

(22) Filed: Jan. 14, 2008

(65) Prior Publication Data

US 2008/0169953 A1    Jul. 17, 2008

(30) Foreign Application Priority Data

Jan. 16, 2007    (JP)    ............... 2007-006821

(51) Int. Cl.
*H03M 3/00*    (2006.01)
(52) U.S. Cl. ...................... 341/143; 341/155
(58) Field of Classification Search ............. 341/143, 341/144, 155
See application file for complete search history.

(56) References Cited

U.S. PATENT DOCUMENTS

2005/0012649 A1*    1/2005    Adams et al. ............. 341/143
2006/0038708 A1*    2/2006    Luh et al. ................ 341/143

OTHER PUBLICATIONS

"Quadrature Bandpass $\Delta\Sigma$ Modulation for Digital Radio" by S. Jantzi, et al., pp. 1935-1950, IEEE Journal of Solid-State Circuits, vol. 32, No. 12, Dec. 1997.

"Multibit Quadrature Sigma-Delta Modulator with Dem Scheme" by R. Maurino, et al. IEEE 2004, pp. 1136-1139.
"A 1.2-V 15-bit 2.5-MS/s Oversampling ADC with Reduced Integrator Swings" by Ki Young Nam, et al, pp. 515-518, IEEE 2004.
"Wideband low-distortion delta-sigma ADC topology" by J. Silva, et al, pp. 737-738, Electronics Letters $7^{th}$ Jun. 2001 vol. 37, No. 12.
"A DSP-Based Digital IF AM/FM Car-Radio Receiver" by F. Adduci, et al, pp. 201-204., IEEE 2003.
"A Low-Voltage Single-OPAMP $4^{th}$-Order Band-Pass $\Delta\Sigma$-Modulator" by T. Salo, et al., pp. 352-355, IEEE 2001.
"80-MHz Bandpass $\Delta\Sigma$ Modulators for Multimode Digital IF Receivers" by T. Salo, et al, pp. 464-474., IEEE Journal of Solid-State Circuits, vol. 38, No. 3, Mar. 2003.

* cited by examiner

*Primary Examiner*—Rexford N Barnie
*Assistant Examiner*—Joseph Lauture
(74) *Attorney, Agent, or Firm*—Mattingly & Malur, P.C.

(57) ABSTRACT

The A/D converter converting an analog input signal into a digital output signal is constructed with a band pass $\Delta\Sigma$ modulator. The band pass $\Delta\Sigma$ modulator includes: a resonator showing a band-pass characteristic at a predetermined frequency and an attenuation characteristic at another frequency; a quantizer; and a local D/A converter. A signal of difference between the analog input signal and a local analog signal of the local D/A converter is supplied to the resonator. The A/D converter further includes an adder for supplying the analog input signal to an input of the quantizer. In addition, signal transmission circuits for reducing the influence of spike noise of the quantizer on the input to the resonator are connected between an input of the adder and an input of resonator selectively. The A/D converter constructed with the band pass $\Delta\Sigma$ modulator is improved in S/N ratio.

23 Claims, 6 Drawing Sheets

SEMICONDUCTOR INTEGRATED CIRCUIT

CLAIM OF PRIORITY

The Present application claims priority from Japanese application JP 2007-006821 filed on Jan. 16, 2007, the content of which is hereby incorporated by reference into this application.

FIELD OF THE INVENTION

The invention relates to a semiconductor integrated circuit including an analog-to-digital (A/D) converter constructed with a band pass ΔΣ modulator. Particularly, the invention relates to a technique useful for improvement of a signal-to-noise (S/N) ratio of an A/D converter constructed with a band pass ΔΣ modulator for digital IF receivers.

BACKGROUND OF THE INVENTION

In mobile communications, typified by mobile phones, receptions of RF (radio frequency) signals from base stations are performed. RF signal down-conversions, which are receiving methods suitable for receivers of mobile phones, are classified into a single-stage type method and a multi-stage type method.

<<Super Heterodyne Receiver>>

Super heterodyne receivers of a multi-stage type have a large number of passive elements, and therefore they are not suitable for integration.

<<Direct Down-conversion Receiver>>

In direct down-conversion receivers of a single-stage type, an orthogonal RF modulator converts RF received signals into DC components directly. Direct down-conversion receivers have an advantage that the level of integration is higher in comparison to super heterodyne receivers.

<<Low IF Receiver>>

In low IF receivers, which are similar to direct down-conversion receivers, RF received signals are converted down into not DC frequencies but intermediate frequencies of hundreds of kilohertz through orthogonal RF down-conversion. The image-rejection filter can be integrated and the merit of direct down-conversion is still retained. However, they require a high performance A/D converter for image rejection. After analog-to-digital conversion, digital signals from the A/D converter undergo down-conversion into digital DC components before digital filtering.

<<Digital IF Receiver>>

In a digital IF receiver, an RF modulator performs first down-conversion of an RF received signal into a first intermediate frequency signal, as described in Non-patent Document 1, Teemu O. salo et al, "80-MHz Band pass ΔΣ Modulators for Multimode Digital IF Receivers", IEEE JOURNAL OF SOLID-STATES CIRCUITS, VOL. 38, NO. 3, MARCH 2003, PP. 464-474. The first intermediate frequency signal is subjected to analog-to-digital conversion by a band pass ΔΣ modulator, which performs high-resolution analog-to-digital conversion of a narrow-band high frequency signal, and thus converted into a digital signal. Through digital signal processing, a software program implements different functions. On this account, a digital IF receiver is flexible. In addition, as a digital IF receiver performs orthogonal mixing and filtering for selection of a channel in digital regions, it allows us to reap the benefit of miniaturization. From this point of view, a digital IF receiver is also flexible. As a band pass ΔΣ modulator conducts high-resolution analog-to-digital (A/D) conversion of narrow-band high frequency signals, it is one of the most possible tools for direct IF digitalization.

<<ΔΣ Modulator>>

In a ΔΣ modulator using an over sampling ratio that a sampling frequency much higher than a Nyquist frequency is utilized, quantization noise spectrums are shaved by a feedback loop. Therefore, in comparison to a traditional Nyquist ratio A/D converter, an over sampling type ΔΣ modulator is less sensitive to nonideal properties of an analog circuit. In a low-pass (LP) ΔΣ modulator with an integrator used as a loop filter, quantization noises are reduced at a DC frequency greatly.

When a resonator is used as a loop filter instead of an integrator, a band pass (BP) ΔΣ modulator is constructed. This is as described in Non-patent Document 2, Teemu Salo et al, "A LOW-VOLTAGE SINGLE-OPAMP 4TH-ORDER BAND PASS ΔΣ MODULATOR", The 2001 IEEE International Symposium on Circuits and Systems, 6-9 May 2001, PP. 352-355. A resonator of a discrete-time type is constituted by two delay devices or integrators connected in series, which have a loop feedback. This resonator includes a switched capacitor (SC) driven by two-phase clocks.

In addition, there is the description on a DSP-based digital IF AM/FM car-radio receiver which includes an A/D converter constructed with a band pass ΔΣ modulator; DSP is flexible, small in chip area, low in power consumption, and superior in performance of signal processing. This is described in Non-patent Document 3, F. Adduci et al, "A DSP-Based Digital IF AM/FM Car-Radio Receiver", Proceedings of the 29th European Solid-State Circuits Conference 16-18 Sep. 2003, PP. 201-204.

Further, in Non-patent Document 4, J. Silva et al, "Wideband low-distortion delta-sigma ADC topology", ELECTRONICS LETTERS, 7 Jun. 2001 Vol. 37, No. 12, PP. 737-738, it is described that in a low-pass (LP) ΔΣ modulator with an integrator used as a loop filter, an analog input signal is directly supplied to an input of a quantizer, whereby the integrator is allowed to handle only quantization noise, and low distortion is achieved.

Also, in Non-patent Document 5, KiYoung Nam et al, "A 1.2-V 15-bit 2.5-MS/s Oversampling ADC with Reduced Integrator Swings", IEEE 2004 CUSTOM INTEGRATED CIRCUITS CONFERENCE, PP. 515-518, it is described that in a low-pass (LP) ΔΣ modulator with an integrator used as a loop filter, an analog input signal is directly supplied to an input of a quantizer, thereby reducing the amplitude of the integrator and suppressing the nonlinearity of the integrator.

Still further, Non-patent Document 6, R. Maurino at al. "MULTIBIT QUADRATURE SIGMA-DELTA MODULATOR WITH DEM SCHEME", Proceedings of the 2004 International Symposium on Circuits and Systems, 6-9 May 2004, PP. 1136-1139, contains the description that in a band pass (BP) ΔΣ modulator of a quadrature type, an analog input signal is directly supplied to an input of a quantizer. The quadrature band pass (BP) ΔΣ modulator described in Non-patent Document 6 produces complex orthogonal digital output signals from complex orthogonal analog input signals composed of real and imaginary parts. This is as described in Non-patent Document 7, Stephen A. Jantzi et al, "Quadrature Bandpass ΔΣ Modulation for Digital Radio", IEEE JOUR-

NAL OF SOLID-STATES CIRCUITS, VOL. 32, NO. 12, DECEMBER 1997, PP. 1935-1950.

SUMMARY OF THE INVENTION

As described Non-patent Document 1, in a digital IF receiver, an RF received signal is subjected to first down-conversion to a first intermediate frequency by an RF modulator. Then, the resultant first intermediate frequency signal undergoes analog-to-digital conversion to a digital signal by a band pass ΔΣ modulator which is operable to perform high resolution analog-to-digital conversion of a narrow-band high frequency signal. Prior to the invention, the inventors developed a digital IF receiver incorporated in an AM/FM radio.

<<Digital IF Receiver Incorporated in AM/FM Radio Developed Prior to the Invention>>

FIG. 1 is a circuit diagram showing a digital IF receiver incorporated in an AM/FM radio developed by the inventors prior to the invention. As shown in the drawing, the digital IF receiver includes an RF analog front-end RF_AFE and a digital signal processing large-scale integrated circuit LSI.

An RF received signal received through an antenna ANT of the AM/FM radio is supplied to an input of an RF band pass filter 1 of the RF analog front-end RF_AFE. An output of the RF band pass filter 1 is supplied to an input of a low-noise amplifier 2. An output of the low-noise amplifier 2 is supplied to an input of a band pass filter 3 for image rejection. An output of the band pass filter 3 is supplied to one input of a receiving mixer 5. An RF local signal from a voltage-control oscillator 4 used as an RF local signal oscillator is supplied to the other input of the receiving mixer 5. In the receiving mixer 5, an RF amplified output signal from the band pass filter 3 and an RF local signal from the voltage-control oscillator 4 are mixed. Then, as a result of the first down-conversion, a first intermediate frequency signal is produced from the output of the receiving mixer 5. The resultant first intermediate frequency signal is amplified by the intermediate frequency amplifier 6, and then supplied to an input of an intermediate frequency band pass filter 7. An output of the intermediate frequency band pass filter 7 is amplified by an AGC amplifier 8, and then supplied to an A/D converter 9 constructed with a band pass delta-sigma modulator BP ΔΣ Mod of the LSI. The A/D converter 9 constructed with a band pass ΔΣ modulator, which performs high-resolution analog-to-digital conversion of a narrow-band high frequency signal, converts a first intermediate frequency analog signal into a digital signal from an analog form to a digital form. Digital output signals from the A/D converter 9 are supplied to a digital signal processor (DSP) 10 of the LSI, and then AM and FM demodulated signals are produced according to demodulation by a software program.

<<A/D Converter with Band Pass ΔΣ Modulator Developed Prior to the Invention>>

FIG. 2 is a diagram showing the A/D converter 9 constructed with the band pass ΔΣ modulator of the digital IF receiver incorporated in the AM/FM radio shown in FIG. 1. An analog input signal Vin, which is an output from the AGC amplifier 8, is supplied to one input terminal of a resonator 92. To the other input terminal of the resonator 92, an output signal from a D/A converter 99 is supplied. The resonator 92 includes an adder 921 and two delay circuits 922 and 923. To a first input terminal of the adder 921, the input signal Vin is supplied. To a second input terminal of the adder 921, an output signal from the delay circuit 923 is supplied, after having been multiplied by −1. Further, an output signal from the D/A converter 99 is supplied to a third input terminal of the adder 921 after having been multiplied by −1. The output signal from the output of the delay circuit 922 as an output signal from the resonator 92 is supplied to one input terminal of a resonator 94. To another input terminal of the resonator 94, an output signal from a D/A converter 96 is supplied. The resonator 94 includes an adder 941 and two delay circuits 942 and 943. To one input terminal of the adder 941, an output signal from the resonator 92 is supplied. To a second input terminal of the adder 941, an output signal from the delay circuit 943 is supplied after having been multiplied by −1. Further, to a third input terminal of the adder 941 is supplied an output signal from the D/A converter 96 after having been doubled. The output signal from the output of the delay circuit 942 as an output signal from the resonator 94 is supplied to an input of a quantizer 95. A digital output signal Vout is produced from an output of the quantizer 95. The digital output signal Vout is a digital output signal which corresponds to the level of the analog input signal Vin. Another digital output signal of the quantizer 95 is transmitted through a delay circuit 97 to the local D/A converter 96 and a delay circuit 98. An output signal from the delay circuit 98 is reversely converted into an analog feedback signal by the local D/A converter 99. The analog feedback signals from the local D/A converters 96 and 99 are fed back to feedback inputs of the resonators 92 and 94, respectively. The two delay circuits 922 and 923 of the resonator 92, the two delay circuits 942 and 943 of the resonator 94, and the delay circuits 97 and 98 each respond to a sampling signal of a sampling frequency fs to delay an input signal.

FIG. 3 is a waveform diagram of assistance in explaining an operation of the resonator 92 of the A/D converter constructed with the band pass ΔΣ modulator shown in FIG. 2. Incidentally, the frequency of the analog input signal Vin satisfies a resonance condition that it is identical to a quarter frequency of the sampling frequency fs. The analog input signal Vin supplied to the first input terminal of the adder 921 used as an input of the resonator 92 shown in FIG. 2, and the sampling signal fs supplied to the delay circuits 922 and 923 are shown in a top portion of FIG. 3. In the delay circuit 922 located in a preceding stage of the resonator 92, a signal delay corresponding to the quarter period of the analog input signal Vin (i.e. the quarter of the period of a signal of the sampling frequency fs) is caused. Further, in the delay circuit 923 located in the subsequent stage of the resonator 92, a signal delay corresponding to the quarter period of the analog input signal Vin is caused. An output signal from the delay circuit 923 is supplied to the second input terminal of the adder 921 after having been multiplied by −1. The adder 921 adds the analog input signal Vin and the output signal of the delay circuit 923 together. Hence, the resonator 92 resonates at a resonance frequency of the frequency of the analog input signal Vin (i.e. the quarter frequency of the sampling frequency fs). The resonator 92 causes a secondary delay because it includes two delay circuits 922 and 923. A delay operation similar to the operation by the preceding-stage resonator 92 is performed by the subsequent-stage resonator 94. Hence, the A/D converter constructed with the band pass ΔΣ modulator including the preceding-stage resonator 92, subsequent-stage resonator 94, quantizer 95, local D/A converters 96 and 99, and delay circuits 97 and 98 causes quaternary delay on the whole.

FIG. 4 is a diagram showing the frequency characteristic of the A/D converter constructed with the band pass ΔΣ modulator shown in FIG. 2. The resonators 92 and 94 of the A/D converter resonate with a resonance frequency f0 (the quarter frequency of the sampling frequency fs) individually. The analog input signal Vin is passed through the resonators 92 and 94 and transmitted to the input of the quantizer 95. The digital output of the quantizer 95 is passed through the delay circuits 97 and 98, converted into analog output signals by the local D/A converters 96 and 99, and input to the resonators 92 and 94. Quantization error resulting from subtraction by the adder 921 is passed through the resonators 92 and 94, quantizer 95, and local D/A converter 99, and fed back to the resonator 92. Specifically, a resonance frequency component of the quantization error leads to a large feedback. As a result, the quantization noise is reduced near the resonance frequency f0 as shown in FIG. 4, and quantization noises at lower and higher frequencies are increased.

However, in development of a digital IF receiver incorporated in an AM/FM radio prior to the invention, the inventors found that the equivalent input noise of the A/D converter constructed with the band pass ΔΣ modulator of the digital IF receiver shown in FIG. 2 was too high to achieve a good S/N ratio.

As already described, this is attributed to the fact that the analog input signal Vin is transmitted to the input of the quantizer 95 through the resonators 92 and 94. The problem of an input dynamic range of the quantizer 95 can be improved by using a multi-bit quantizer to form the quantizer 95. However, when an inside signal of the resonator 92 exceeds the inside dynamic range of the resonator 92, the accuracy of analog-to-digital conversion by the A/D converter constructed with the band pass ΔΣ modulator is deteriorated. Hence, it is necessary to set the gain of the resonator 92 to a low value so that the inside signal of the resonator 92 never exceeds the insider dynamic range of the resonator 92. However, the decrease in the gain of the resonator 92 increases the equivalent input noise of the resonator 92, and thus a good S/N ratio cannot be obtained.

Therefore, it is an object of the invention to improve the S/N ratio of the A/D converter constructed with the band pass ΔΣ modulator.

The above and other objects and novel features of the invention will be clear from the description hereof and the accompanying drawings.

Of forms of a semiconductor integrated circuit disclosed therein, the preferred ones will be described below in brief outline.

A preferred semiconductor integrated circuit according to the invention includes an A/D converter which is constructed with a non-quadrature band pass ΔΣ modulator (BPΔΣMod), and converts an analog input signal (Vin) into a digital output signal (Vout). The band pass ΔΣ modulator includes: a resonator (92, 94) responding to the analog input signal to show a band-pass characteristic at a predetermined frequency (f0), and show an attenuation characteristic at a frequency different from the predetermined frequency; a quantizer (95) to which an output signal of the resonator is supplied; and a local D/A converter (96) to which an output signal of the quantizer is supplied. The band pass ΔΣ modulator produces a signal of difference between the analog input signal and an output of a local analog signal of the local D/A converter, and supplies the resultant signal to the resonator. The band pass ΔΣ modulator further includes an adder (Add) for supplying the analog input signal to an input of the quantizer.

Therefore, the adder (Add) forms a feedforward path (Ffd) for supplying the analog input signal (Vin) to the input of the quantizer (95). Substantially only a quantization error of the difference between a digital output of the quantizer (95) with respect to the analog input signal (Vin) and the analog input signal (Vin) is supplied to the inside of the resonator (92, 94). The level of a signal formed by only the quantization error supplied to the inside of the resonator is lowered widely in comparison to the signal level obtained in the band pass ΔΣ modulator as shown in FIG. 2. Hence, the gain of the resonator can be made larger, and the equivalent input noise of the resonator can be reduced. Thus, a good S/N ratio can be achieved.

The inventors thus conceived a basic technical idea of the invention concerning an A/D converter constructed with a non-quadrature band pass ΔΣ modulator that a feedforward path for supplying an analog input signal to an input of a quantizer is provided and a quantization error is supplied to an input of a resonator, thereby reducing the level of an input signal of the resonator greatly. Now, it is noted that a non-quadrature band pass ΔΣ modulator associated with the invention is not affected by an overhead caused by an orthogonal mixer and the variation between two routes, which become problems for a band pass ΔΣ modulator of a quadrature type.

In Non-patent Documents 4 and 5, it is described that in a low-pass (LP) ΔΣ modulator with an integrator used as a loop filter, an analog input signal is directly supplied to an input of a quantizer. However, the non-patent documents do not contain any description about a first half portion of the basic technical idea of the invention, i.e. a band pass (BP) ΔΣ modulator of a non-quadrature type.

Further, it is described in Non-patent Document 6 that in a band pass (BP) ΔΣ modulator of a quadrature type, an analog input signal is directly supplied to an input of a quantizer. However, Non-patent Document 6 does not contain any description concerning a first half portion of the basic technical idea of the invention, i.e. a band pass (BP) ΔΣ modulator of a non-quadrature type. Also, in this document, the following descriptions are not contained. The first is that the level of an input signal to a resonator is lowered greatly and the gain of the resonator can be made higher. The second is that the equivalent input noise of the resonator is lowered, and therefore a good S/N ratio can be achieved.

Of the forms of a semiconductor integrated circuit disclosed therein, the effect offered by the preferred ones is as follows in brief. That is, the invention makes it possible to improve the S/N ratio of an A/D converter constructed with a band pass ΔΣ modulator.

DETAILED DESCRIPTION OF THE PREFERRED EMBODIMENTS

1. Summary of the Preferred Embodiments

Figure 1:
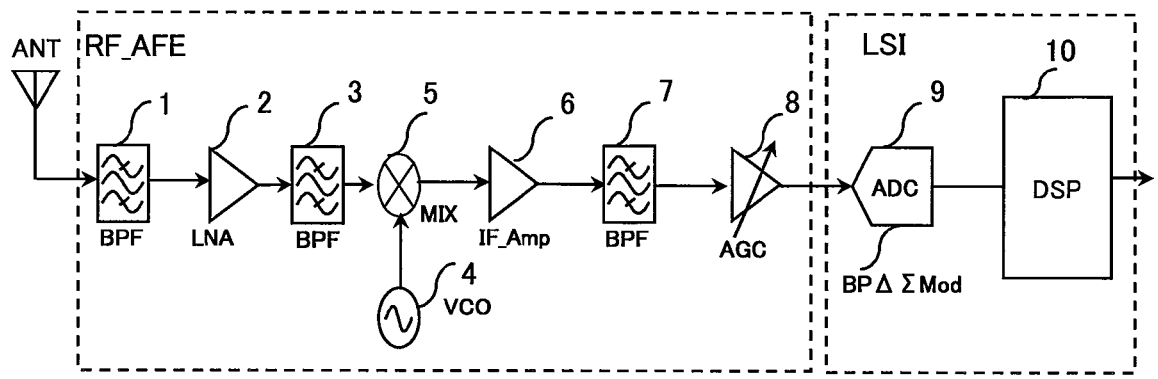
FIG. 1 is a circuit diagram showing a digital IF receiver incorporated in an AM/FM radio developed by the inventors prior to the invention, and the digital IF receiver is identical to a digital IF receiver incorporated in an AM/FM radio according to an embodiment of the invention.

First, the preferred embodiments of the invention disclosed therein will be described in brief outline. The reference numerals and characters of the drawings for making reference which are put here in parentheses only exemplarily show what the concepts of the constituent elements marked with the reference numerals and characters contain.

[1] A semiconductor integrated circuit (LSI) according to a preferred embodiment of the invention includes an A/D converter (9) which is constructed with a non-quadrature band pass ΔΣ modulator (BPΔΣMod) and converts an analog input signal (Vin) into a digital output signal (Vout). The band pass ΔΣ modulator includes a resonator (92, 94) responding to the analog input signal to show a band-pass characteristic at a predetermined frequency (f0), and show an attenuation characteristic at a frequency different from the predetermined frequency. The band pass ΔΣ modulator includes a quantizer (95) to which an output signal of the resonator is supplied, and a local D/A converter (96) to which an output signal of the quantizer is supplied. The band pass ΔΣ modulator produces a signal of difference between the analog input signal and an output of a local analog signal of the local D/A converter (96), and supplies the resultant signal to the resonator. The band pass ΔΣ modulator further includes an adder (Add) for supplying the analog input signal to an input of the quantizer (see FIG. 5).

Figure 2:
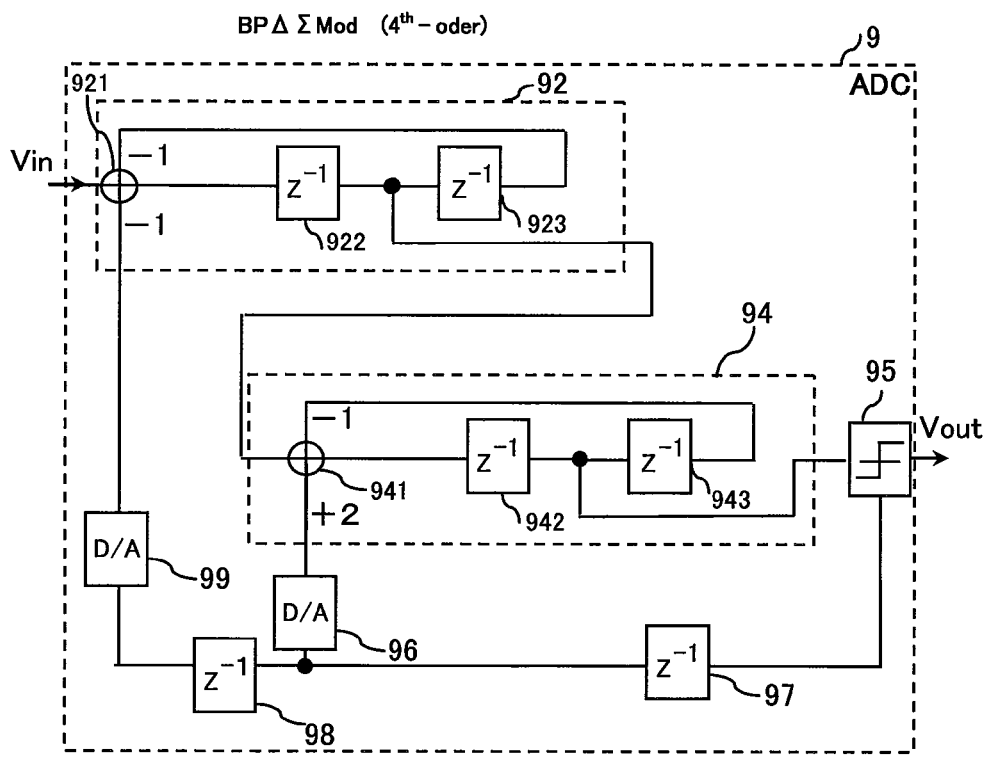
FIG. 2 is a diagram showing an A/D converter constructed with a band pass ΔΣ modulator of the digital IF receiver as shown in FIG. 1.
Figure 3:
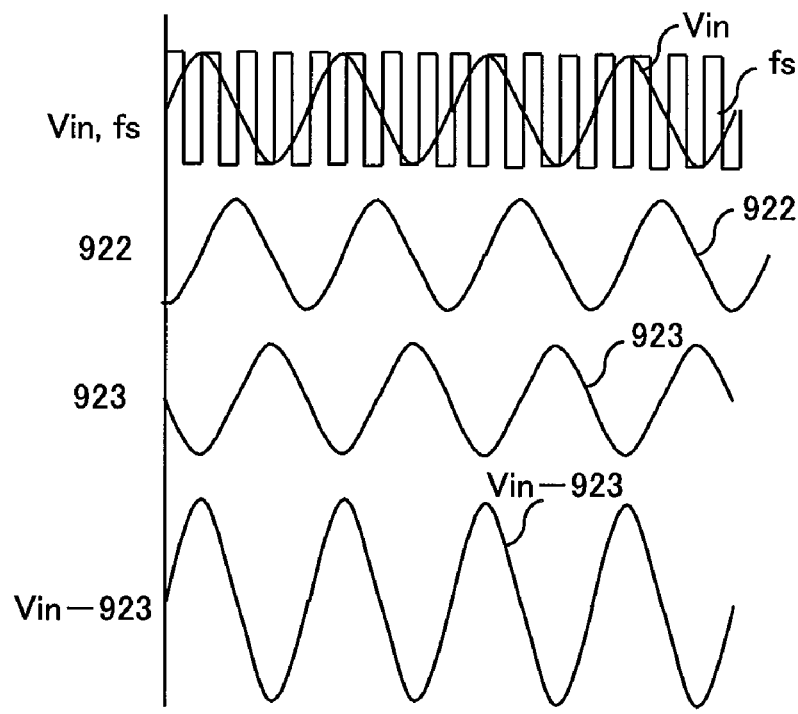
FIG. 3 is a waveform diagram of assistance in explaining an operation of a double delay resonator 92 of the A/D converter constructed with the band pass ΔΣ modulator as shown in FIG. 2.
Figure 4:
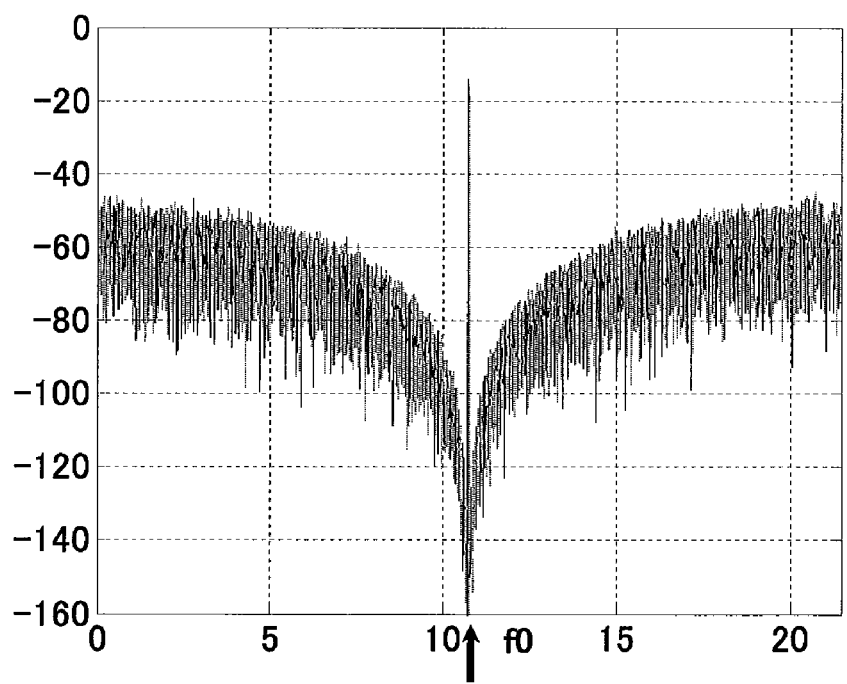
FIG. 4 is a plot showing the frequency characteristic of the A/D converter constructed with the band pass ΔΣ modulator as shown in FIG. 2.

According to the above-described embodiment, the adder (Add) forms a feedforward path (Ffd) for supplying the analog input signal to the input of the quantizer. A quantization error of the difference between a digital output of the quantizer with respect to the analog input signal and the analog input signal is produced in an input portion of the resonator (92, 94). The level of a signal formed by only the quantization error supplied to the inside of the resonator is lowered widely in comparison to the signal level obtained in the band pass ΔΣ modulator as shown in FIG. 2. Hence, the gain of the resonator can be made larger, and the equivalent input noise of the resonator can be reduced. Thus, a good S/N ratio can be achieved.

In a preferred form for embodying the invention, the resonator, the quantizer, and the local D/A converter operate in response to a sampling signal (Φs) having a predetermined frequency (fs). The predetermined frequency of the sampling signal is set so as to have an error from a quadruple of the highest frequency fin (Max) of the analog input signal.

Therefore, according to the above-described preferred form, it becomes possible to reduce the influence of odd harmonics of the sampling signal.

Figure 6:
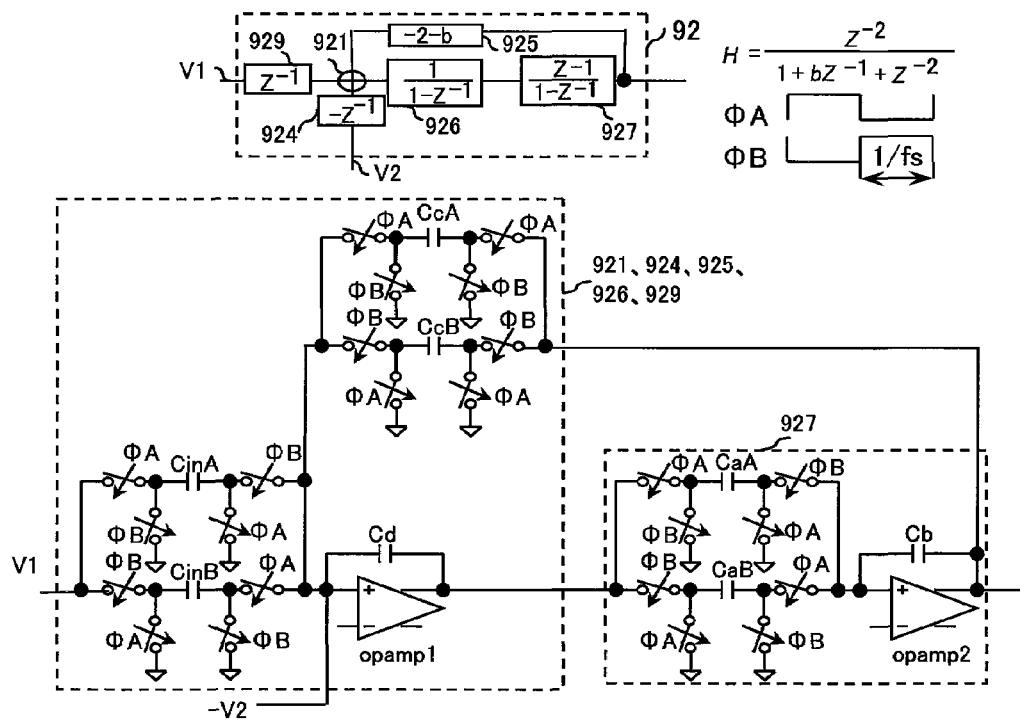
FIG. 6 is a diagram showing a configuration of a resonator in a preceding stage inside the band pass ΔΣ modulator as shown in FIG. 5.

In a more preferred form for embodying the invention, the resonator (92) includes integration circuits (926, 927) connected in series between an input and an output of the resonator, and a feedback circuit (925) connected between the output and input of the resonator (see FIG. 6).

Therefore, according to the above-described more preferred form, for the predetermined frequency, the error from a quadruple of the highest frequency of the analog input signal can be set by a coefficient (−2−b) of the feedback circuit.

In a specific form for embodying the invention, at least one integration circuit (927) of the integration circuits of the resonator (92) is arranged according to a double-sampling architecture. Specifically, the integration circuit (927) includes two sampling capacitors (CaA, CaB), and switches of two routes controlled by sampling switch signals (ΦA, ΦB) which are half the predetermined frequency of the sampling signal and opposite in phase (see FIG. 6).

Figure 5:
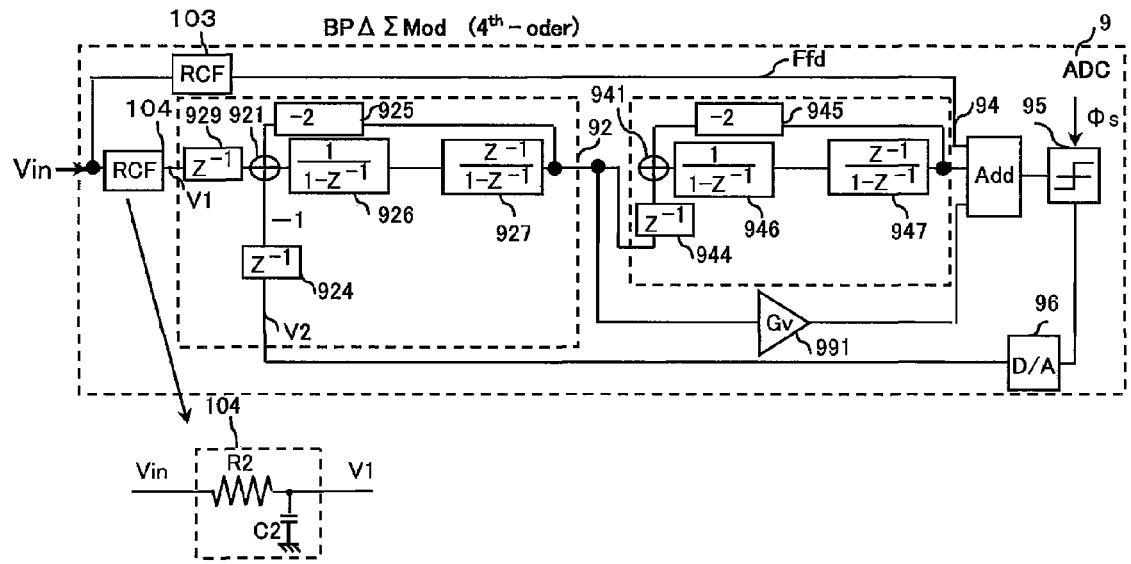
FIG. 5 is a diagram showing the A/D converter 9 constructed with a band pass ΔΣ modulator of the digital IF receiver incorporated in an AM/FM radio according to the embodiment of the invention as shown in FIG. 1.

In a specific form for embodying the invention, the non-quadrature band pass ΔΣ modulator (BPΔΣMod) converts a single analog input signal (Vin) into a single digital output signal (Vout) (see FIG. 5).

[2] A semiconductor integrated circuit (LSI) according to another embodiment of the invention includes an A/D converter which is constructed with a non-quadrature band pass ΔΣ modulator (BPΔΣMod) and converts an analog input signal (Vin) into a digital output signal (Vout). The band pass ΔΣ modulator includes a resonator (92, 94) responding to the analog input signal to show a band-pass characteristic at a predetermined frequency (f0), and show an attenuation characteristic at a frequency different from the predetermined frequency. The band pass ΔΣ modulator includes a quantizer (95) to which an output signal of the resonator is supplied, and a local D/A converter (96) to which an output signal of the quantizer is supplied. The band pass ΔΣ modulator produces a signal of difference between the analog input signal and an output of a local analog signal of the local D/A converter (96), and supplies the resultant signal to the resonator. The band pass ΔΣ modulator further includes an adder (Add) for supplying the analog input signal to an input of the quantizer (see FIG. 5). The band pass ΔΣ modulator includes a signal transmission circuit (103, 104, 101) which supplies the analog input signal to an input of the adder, and reduces influence of spike noise of the quantizer on the input to the resonator between the input of the adder and an input of the resonator (see FIGS. 5, 8, 9 and 11).

Thus, the influence of spike noise of the quantizer on the input signal to the resonator can be reduced.

In a preferred form for embodying the invention, the signal transmission circuit is composed of any one selected from a combination of low-pass filters (103, 104), a voltage follower (101) and a combination of signal delay circuits (103, 104).

[3] A semiconductor integrated circuit (LSI) according to another embodiment of the invention includes, in its semiconductor chip, an RF analog front-end (RF_AFE), an A/D converter (9), and a digital signal processing unit (DSP). The RF analog front-end includes a low-noise amplifier (2), an RF local signal oscillator (4) and a receiving mixer (5). The A/D converter is constructed with a band pass ΔΣ modulator (BP-ΔΣMod) which converts an analog input signal (Vin) into a digital output signal (Vout).

The low-noise amplifier amplifies an RF received signal received through an antenna (ANT). The resultant RF amplified signal of the low-noise amplifier is supplied to one input of the receiving mixer. An RF local signal from the RF local signal oscillator is supplied to the other input of the receiving mixer. The receiving mixer mixes the RF amplified output signal and the RF local signal, and then a first intermediate frequency signal is produced by first down-conversion from an output of the receiving mixer.

When the first intermediate frequency signal is supplied to the A/D converter constructed with the band pass ΔΣ modulator, the A/D converter executes analog-to-digital conversion of the first intermediate frequency from an analog signal to a digital signal. Particularly, the band pass ΔΣ modulator of a non-quadrature type includes an adder (Add) for supplying the analog input signal to an input of a quantizer (see FIG. 5). In addition, the band pass ΔΣ modulator selectively includes a signal transmission circuit (103, 104, 101) for reducing the influence of spike noise of the quantizer on the input of the resonator between the input of the adder and the input of the resonator (see FIGS. 5, 8, 9 and 11).

In a preferred form for embodying the invention, RF amplified signals having frequency bands are converted in frequency into the first intermediate frequency signal of a common frequency by the first down-conversion in the receiving mixer.

In a more preferred form for embodying the invention, the RF amplified signals consist of RF received signals for FM radios and RF received signals for AM radios.

In another more preferred form for embodying the invention, the RF amplified signals consist of at least two kinds of RF received signals selected from RF received signals of GSM850, GSM900, DCS1800, PCS1900 and WCDMA.

2. Further Detailed Description of the Preferred Embodiments

Now, further detailed description of the embodiments will be presented. The best forms for embodying the invention will be described below in detail with reference to the drawings. It is noted that in all the drawings for explanation of the best forms for embodying the invention, members having identical functions are identified by the same reference numeral or character, and the repeated description thereof is omitted.

<<Digital IF Receiver Incorporated in AM/FM Radio According to One Embodiment of the Invention>>

FIG. 1 is a circuit diagram showing a digital IF receiver incorporated in an AM/FM radio according to one embodiment of the invention. As shown in the drawing, the digital IF receiver includes an RF analog front-end RF_AFE and a digital signal processing large-scale integrated circuit LSI.

An RF received signal received through the antenna ANT of the AM/FM radio is supplied to the input of the RF band pass filter 1 of the RF analog front-end RF_AFE. An output of the RF band pass filter 1 is supplied to the input of the low-noise amplifier 2. An output of the low-noise amplifier 2 is supplied to the input of the band pass filter 3 for image rejection. An output of the band pass filter 3 for image rejection is supplied to one input of the receiving mixer 5. An RF local signal from the voltage-control oscillator 4 used as an RF local signal oscillator is supplied to the other input of the receiving mixer 5. In the receiving mixer 5, an RF amplified output signal from the band pass filter 3 and an RF local signal from the voltage-control oscillator 4 are mixed, and as a result of the first down-conversion, the first intermediate frequency signal is produced from the output of the receiving mixer 5. RF received signals for FM radios range from 65 to 108 MHz, and RF received signals for AM radios range from 145 kHz to 10 MHz. The RF analog front-end RF_AFE converts, in frequency, RF received signals for FM radios and RF received signals for AM radios into first intermediate frequency signals of a common frequency (e.g. 10.7 MHz). As a result, it becomes possible to use the voltage-control oscillator 4, the receiving mixer 5, the intermediate frequency amplifier 6, the intermediate frequency band pass filter 7, the AGC amplifier 8 and the A/D converter 9 in common when arranging an AM/FM radio. The resultant first intermediate frequency signals are amplified by the intermediate frequency amplifier 6, and then supplied to the input of an intermediate frequency band pass filter 7. An output of the intermediate frequency band pass filter 7 is amplified by the AGC amplifier 8, and then supplied to the A/D converter 9 constructed with a band pass delta-sigma modulator BP ΔΣ Mod of the LSI. In the A/D converter 9 constructed with a band pass ΔΣ modulator which performs high-resolution analog-to-digital conversion of a narrow-band high frequency signal, analog-to-digital conversion of a first intermediate frequency analog signal to a digital signal is carried out. A digital output signal from the A/D converter 9 is supplied to the digital signal processor (DSP) 10 of the LSI, and then an AM or FM demodulated signal is produced according to demodulation by a software program.

<<Digital IF Receiver Incorporated in Mobile Phone According to Another Embodiment of the Invention>>

A digital IF receiver as another embodiment of the invention is incorporated in a multimode and multiband mobile phone. In this case, multimode and multiband RF received signals having different frequencies of GSM850, GSM900, DCS1800, PCS1900 and WCDMA are converted, in frequency, into first intermediate frequency signals of a common frequency (e.g. 60 MHz) in the RF analog front-end RF_AFE of the mobile phone as shown in FIG. 1 according to the first down-conversion. To make such conversion possible, the voltage-control oscillator 4 used as an RF local signal oscillator produces RF local signals of two or more frequency bands. The RF receiving frequency of GSM850 ranges 869 to 894 MHz, and that of GSM900 ranges 925 to 960 MHz. Further, the RF receiving frequency of DCS1800 ranges 1805 to 1880 MHz. The RF receiving frequency of PCS1900 ranges 1930 to 1990 MHz. The RF receiving frequency of WCDMA is between 2110 to 2170 MHz. Herein, GSM is a shortened form of Global System for Mobile Communication, DCS is a shortened form of Digital Cellular System, PCS is a shortened form of Personal Communication System, and WCDAM is a shortened form of Wideband Code Division Multiple Access. The voltage-control oscillator 4 used as an RF local signal oscillator includes a voltage control oscillation circuit and a divider circuit. In any case, the voltage control oscillation circuit oscillates in a high frequency band, and when low RF receiving frequency signals of GSM850 and GSM900 are received, the divider circuit divides an oscillating output signal of the voltage control oscillation circuit and supplies the resultant post-division local signal to the other input of the receiving mixer 5. Thus, it becomes possible to convert, in frequency, RF received signals having difference frequencies of GSM850, GSM900, DCS1800, PCS1900 and WCDMA into first intermediate frequency signals of a common frequency of 60 MHz according to the first down-conversion. The first intermediate frequency signals can be converted from an analog form to a digital form by the A/D converter 9 constructed with a band pass ΔΣ modulator, and thus turned into digital signals. Digital output signals from the A/D converter 9 are supplied to the digital signal processor (DSP) 10 of the LSI, and then base band demodulated signals are produced according to demodulation by a software program.

<<Basic A/D Converter Constructed with Band Pass ΔΣ Modulator according to One Embodiment of the Invention>>

FIG. 5 is a diagram showing the A/D converter 9 constructed with a band pass ΔΣ modulator of the digital IF receiver incorporated in an AM/FM radio according to the embodiment of the invention as shown in FIG. 1. The A/D converter 9 shown in FIG. 5 is constructed with a non-quadrature band pass ΔΣ modulator (BP ΔΣMod) different from quadrature band pass (BP) ΔΣ modulators described in Non-patent Documents 6 and 7 cited above, and converts a single analog input signal (Vin) into a single digital output signal (Vout). The single analog input signal and the single digital output signal exclude complex orthogonal analog input signals and complex orthogonal digital output signals, which consist of mutually independent real and imaginary parts as described in Non-patent Document 7 cited above. However, the single analog input signal and the single digital output signal not exclude, but include non-inverted and inverted single input signals, and non-inverted and inverted single output signals, which are in mutual dependence, respectively.

The A/D converter 9 according to the embodiment of the invention basically differs from the A/D converter 9 shown in FIG. 2, which was developed by the inventors prior to the invention in that the A/D converter 9 as shown in FIG. 5 further includes an adder Add for supplying the analog input signal Vin to the input of the quantizer 95. The low-pass filters 103 and 104, specifically signal delay circuits 103 and 104, which are added to the A/D converter 9 as shown in FIG. 5, are just secondary differences, and they are to be described later in detail. It is noted that the quantizer 95 is sometimes refereed to as ADC (analog-to-digital converter).

Therefore, in the A/D converter 9 as shown in FIG. 5, the adder Add, which is a basic difference, forms a direct feedforward path Ffd for directly supplying the analog input signal Vin to the input of the quantizer 95. As the time delay by the low-pass filter 103 is set to be small to the extent that it can be ignored in comparison to the time delays by the resonators 92 and 94, the analog input signal Vin is supplied to the input of the quantizer 95 through the direct feedforward path Ffd and the adder Add without any substantial time delay. In a relatively short time, a digital output of the quantizer 95 is inversely converted into an analog feedback signal by the local D/A converter 96. An analog feedback signal from the local D/A converter 96 is fed back to the input of the resonator 92. A quantization error of the difference between the analog feedback signal resulting from inverse conversion of a digital output of the quantizer 95, and the analog input signal Vin having passed through the low-pass filter 104 is produced in an input portion 921 of the resonator 92. In the A/D converter 9 as shown in FIG. 5, the level of a signal supplied to the insides of the resonators 92 and 94, which substantially consists of only the quantization error, is largely lowered in comparison to the signal level in the case of the band pass ΔΣ modulator as shown in FIG. 2. Therefore, it is possible to achieve the resonators 92 and 94 having high gains. As a result, the equivalent input noises of the resonators 92 and 94 are reduced, and a good S/N ratio can be attained. The high gain of the resonator 92 can be materialized by making gain coefficients k1 and k2 of two integration circuits 926 and 927 of the resonator 92 larger values. Likewise, the high gain of the resonator 94 can be realized by making gain coefficients k3 and k4 of two integration circuits 946 and 947 of the resonator 94 larger values.

The analog input signal Vin, which is an output of the AGC amplifier 8, and an AM/FM common first intermediate frequency signal of 10.7 MHz of the digital IF receiver incorporated in an AM/FM radio as shown in FIG. 1 is supplied to the input of the quantizer 95 through the low-pass filter 103 and the direct feedforward path Ffd. Also, the analog input signal Vin, i.e. the output of the AGC amplifier 8, is supplied to one input terminal of the resonator 92 through the low-pass filter 104, which has been set to have a large delay time as described above. To the other input terminal of the resonator 92, an analog feedback signal resulting from inverse conversion of a digital output from the local D/A converter 96 is supplied. The resonator 92 includes an adder 921, two delay circuits 924 and 929 and two integration circuits 926 and 927. To a first input terminal of the adder 921, the input signal Vin is supplied through the delay circuit 929. To a second input terminal of the adder 921, an output signal of the D/A converter 96 is supplied through the delay circuit 924 after having been multiplied by −1. To a third input terminal of the adder 921, an output signal of an integration circuit 927 is supplied through a feedback circuit 925. An output of the resonator 92 is supplied to an input of the resonator 94, and concurrently supplied to the adder Add through an amplifier 991. The resonator 94 includes an adder 941, two integration circuits 946 and 947 and a delay circuit 944. To one input terminal of the adder 941, an output signal of the resonator 92 is supplied through the delay circuit 944; to the other input terminal of the adder 941, an output signal of the integration circuit 947 is supplied through a feedback circuit 945. To a first input terminal of the adder Add, the analog input signal Vin is supplied through the low-pass filter 103 and the direct feedforward path Ffd; an output signal of the resonator 94 is supplied to a second input terminal thereof. Further, to a third input terminal of the adder Add, an output signal of the resonator 92 is supplied after having been multiplied by Gv by the amplifier 991. Then, a value resulting from addition of the three input signals of the adder Add is supplied to the input of the quantizer 95. Then, the digital output signal Vout is produced from an output of the quantizer 95. The digital output signal Vout is one which corresponds to the level of the analog input signal Vin. Other digital output signals of the quantizer 95 are inversely converted into analog feedback signals by the local D/A converter 96. An analog feedback signal from the local D/A converter 96 is fed back to the input of the resonator 92. The two integration circuits 926 and 927 of the resonator 92, the two integration circuits 946 and 947 of the resonator 94, and the delay circuits 921, 924 and 944 delay input signals thereto in response to a sampling signal having a sampling frequency fs quadruple to the highest frequency fin (Max) of the analog input signal Vin respectively. Also, the sampling signal of the sampling frequency fs quadruple to the highest frequency fin (Max) of the analog input signal Vin is supplied to the quantizer 95 and the local D/A converter 96. As the center frequency of the FM/AM common first intermediate frequency signal of the digital IF receiver incorporated in the AM/FM radio as shown in FIG. 1 is 10.7 MHz, the highest frequency fin (Max) of the analog input signal Vin is about 11 MHz. Therefore, the sampling frequency fs of the sampling signal is about 44 MHz.

<<Reduction of Spike Noise in Sampling>>

Figure 8:
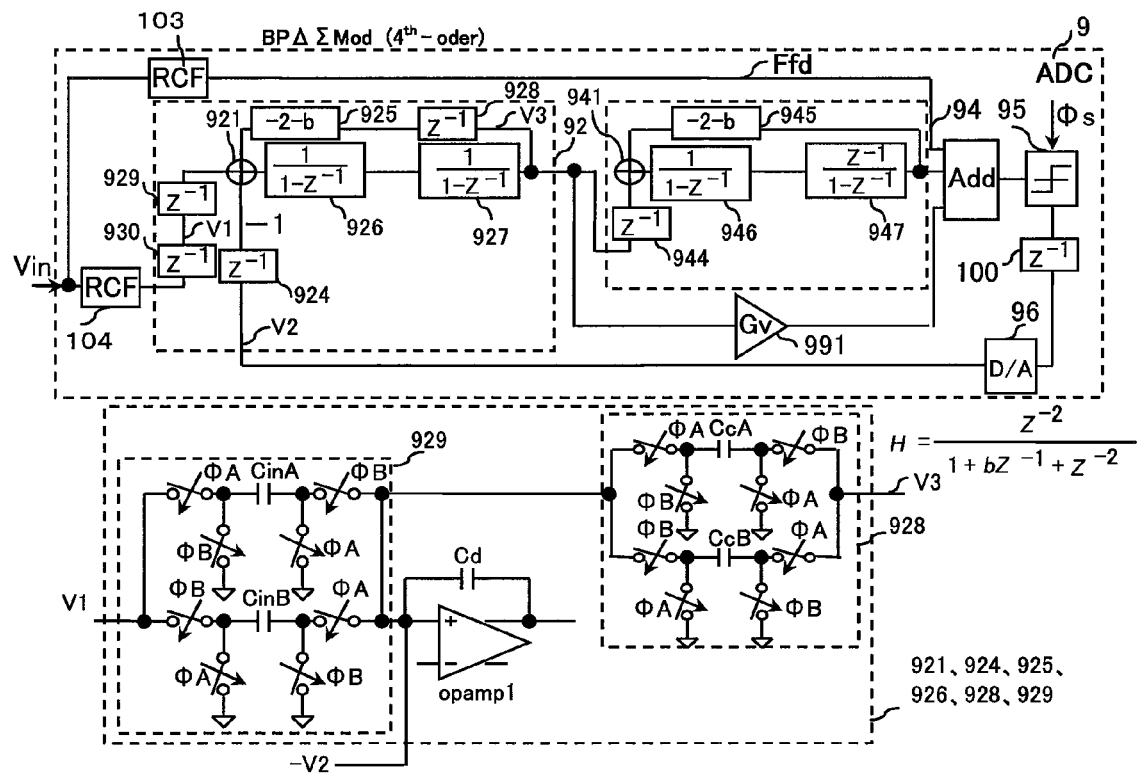
FIG. 8 is a diagram showing an A/D converter 9 constructed with a band pass ΔΣ modulator according to another embodiment of the invention for the digital IF receiver incorporated in an AM/FM radio as shown in FIG. 1.
Figure 9:
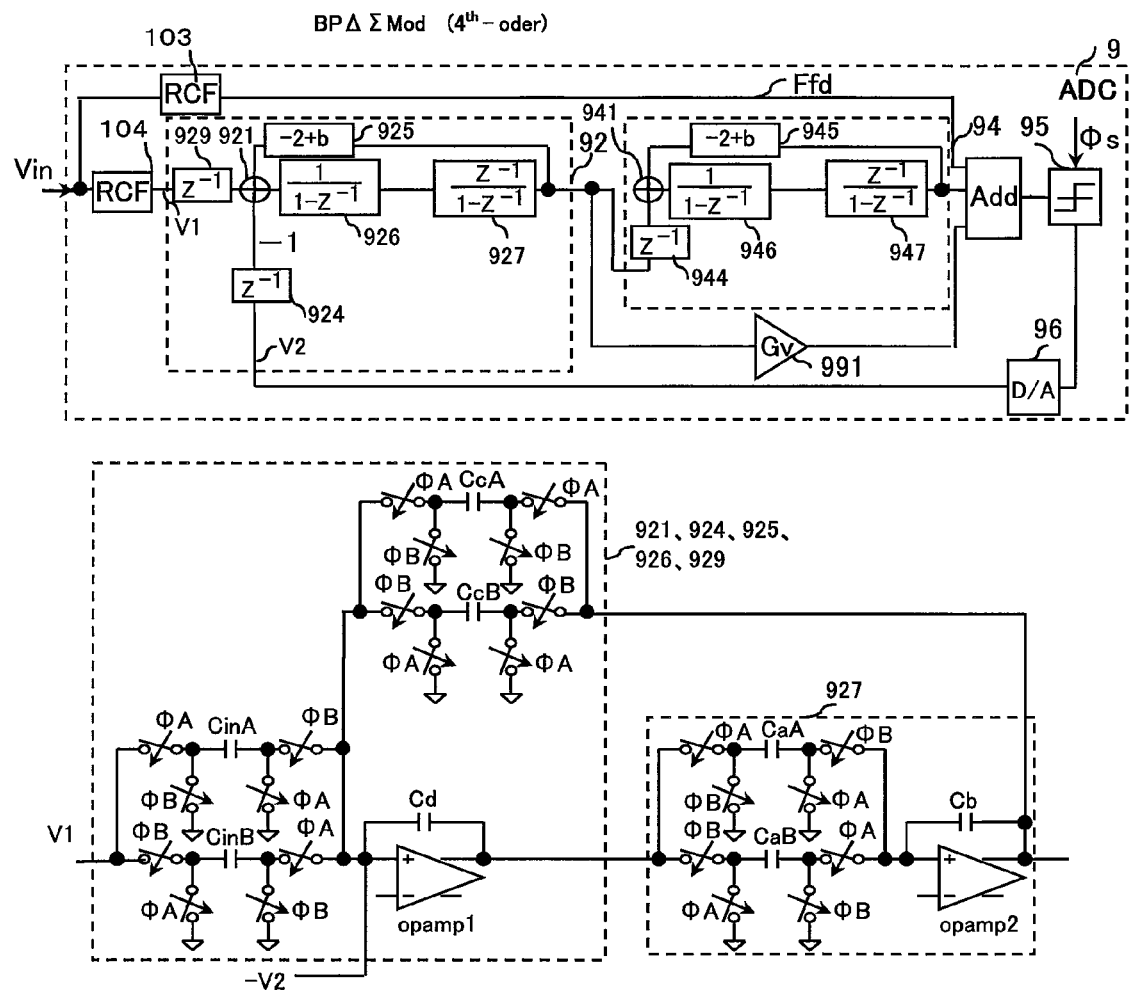
FIG. 9 is a diagram showing an A/D converter 9 constructed with a band pass ΔΣ modulator according to another embodiment of the invention for the digital IF receiver incorporated in an AM/FM radio as shown in FIG. 1.
Figure 10:
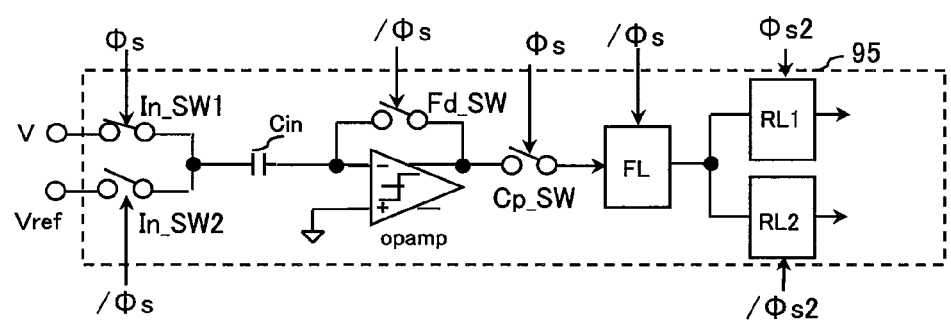
FIG. 10 is a circuit diagram showing a configuration of the quantizer of the A/D converter constructed with the band pass ΔΣ modulator as shown in FIG. 5, 8 or 9.

However, at the time of sampling by a sampling signal Φs of the sampling frequency fs, a high-level spike noise arising in the quantizer 95 can be input to the resonator 92 through the adder Add and the direct feedforward path Ffd. FIG. 10 is a circuit diagram showing a configuration of the quantizer 95 of the A/D converter 9 constructed with a band pass ΔΣ modulator as shown in FIG. 5, 8 or 9. As shown in the drawing, the quantizer 95 includes a voltage comparator constituted by an input switch In_SW1 for supplying an input signal V, a reference switch In_SW2 for supplying a reference voltage Vref, a sampling capacitor Cin, an operational amplifier opamp, and a feedback switch Fd_SW. A spike noise signal component of the sampling signal Φs which activates the input switch In_SW1 travels through the input switch In_SW1 to the input of the quantizer 95, and then goes from the input of the quantizer 95 through the adder Add and the direct feedforward path Ffd into the resonator 92. It has been clearly shown from the study by the inventors that the spike noise signal component deteriorates the S/N ratio of the A/D converter constructed with the band pass ΔΣ modulator when it is entered into the resonator 92 in this way.

The low-pass filters 103 and 104 added to the A/D converter 9 as shown in FIG. 5 lower the level at which a spike noise component from the quantizer 95 owing to the sampling signal Φs of the sampling frequency fs, is entered into the resonator 92. The low-pass filters 103 and 104 are each constituted by a resistor R2 and a capacitor C2. The low-pass filters 103 and 104 transmit the analog input signal Vin having a center frequency of 10.7 MHz substantially without attenuation, however the low-pass filters attenuate a spike noise component having a frequency of about 44 MHz sufficiently. Also, the low-pass filter 103 has the function of lowering the level of an EMI interference signal which is transmitted from the large-scale integrated circuit LSI to the RF analog front-end RF_AFE in the digital IF receiver as shown in FIG. 1. In other words, a spike noise component having a frequency of about 44 MHz from the input of the A/D converter 9 of the LSI is attenuated by the low-pass filter 103 and transmitted to the input terminal for the analog input signal Vin.

<<Reduction of Influence of Harmonic Distortion>>

In the above-described embodiment, the sampling frequency fs of the sampling signal Φs is set to a frequency quadruple to the highest frequency fin (Max) of the analog input signal Vin. However, in this case, under the influence of the harmonic distortion of the sampling signal Φs caused by the distortion of an internal circuit of the A/D converter 9 as shown in FIG. 5, reflection of odd harmonics deteriorates the S/N ratio. To avoid the issue, the sampling frequency fs of the sampling signal Φs is arranged to have an error from a quadruple of the highest frequency fin (Max) of the analog input signal Vin. For instance, when the center frequency of the analog input signal Vin is 10.7 MHz, the sampling frequency fs of the sampling signal Φs is set to 37 MHz.

Figure 7:
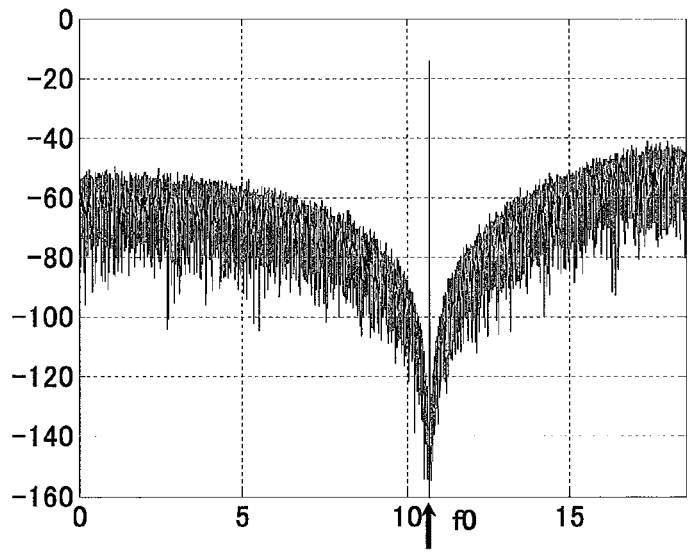
FIG. 7 is a plot showing the frequency characteristic of the A/D converter constructed with the band pass ΔΣ modulator shown in FIG. 5.

FIG. 6 is a diagram showing a configuration of the preceding-stage resonator 92 inside the band pass ΔΣ modulator as shown in FIG. 5, which enables the arrangement as described above to be made. Also, the subsequent-stage resonator 94 can be arranged substantially in the same way as the preceding-stage resonator 92 is arranged. The preceding-stage resonator 92 includes integrator circuits 926 and 927, delay circuits 924 and 929, and a feedback circuit 925 having a coefficient (−2−b). Particularly, an error of any value can be materialized with the coefficient of the feedback circuit 925. FIG. 7 is a plot showing the frequency characteristic of the A/D converter constructed with the band pass ΔΣ modulator shown in FIG. 5.

<<Double-Sampling Architecture>>

As for a band pass (BP) ΔΣ modulator having a resonator used as a loop filter instead of an integrator, the frequency of the analog input signal and the sampling frequency of the sampling signal of the resonator become higher in comparison to a low-pass (LP) ΔΣ modulator with an integrator used as a loop filter. Usually, the power consumption by an A/D converter constructed with a band pass (BP) ΔΣ modulator is increased with an increase in frequency.

In the configuration of the preceding-stage resonator 92 shown in FIG. 6, the double-sampling architecture is adopted for sampling circuit portions of the delay circuit 924, delay circuit 929, feedback circuit 925 and integration circuit 927, whereby lower power consumption is achieved. Switches of two routes, which are activated by sampling switch signals ΦA and ΦB mutually opposite in phase, are connected with parallel sampling capacitors CinA and CinB of each of these sampling circuit portions. The frequency of the sampling switch signals ΦA and ΦB mutually opposite in phase are set to be a frequency fs/2 which is half the sampling frequency fs of the sampling signal Φs, and the power consumption is reduced to the half. The operational amplifiers opamp1 and opamp2, integration capacitors Cd and Cb, and sampling capacitors CinA, CinB, CcA, CcB, CaA and CaB constitute an integrator. The timing of sampling switches, and the capacitance ratio of a sampling capacitance and an integration capacitance realize the delay effects of the delay circuits 924 and 929 and the integration circuit 927 and the signal amplification effect of the feedback circuit 925 respectively.

<<Pipeline Operation of Quantizer and Local D/A Converter>>

FIG. 8 is a diagram showing an A/D converter 9 constructed with a band pass ΔΣ modulator according to another embodiment of the invention for the digital IF receiver incorporated in an AM/FM radio as shown in FIG. 1.

As shown in FIG. 8, a delay circuit 100 for absorbing the difference between the timing of a digital output signal of the quantizer 95 and the timing of inverse conversion into an analog feedback signal by the local D/A converter 96 is placed between an output of the quantizer 95 and an input of the local D/A converter 96. When the quantizer and local D/A converter are made to operate under pipeline control, the timing margin of the operations of the quantizer and local D/A converter are enlarged. In parallel to the operations, the timing to supply the analog input signal Vin to the adder 921 through the low-pass filter 104 is delayed. In other words, a delay circuit 930 is connected to the delay circuit 929 located in an input portion of the resonator 92, whereby the matching of operation timing is achieved.

<<Non-Pipeline Operation of Quantizer and Local D/A Converter>>

There is also a problem that the overhead is increased owing to the addition of the delay circuit 930 as shown in FIG. 8. When an operational amplifier is used to constitute a delay circuit, the power consumption is increased significantly. Even if a configuration without an operational amplifier is adopted, a sampling capacitor which occupies a large area and is located on another route is needed, the increase in area becomes a problem.

FIG. 9 is a diagram showing an A/D converter 9 constructed with a band pass ΔΣ modulator according to another embodiment of the invention for the digital IF receiver incorporated in an AM/FM radio as shown in FIG. 1. For the A/D converter 9 constructed with a band pass ΔΣ modulator as shown in FIG. 9, the delay circuit 100 of the A/D converter 9 and the additional delay circuit 930 as shown in FIG. 8 are removed.

FIG. 10 is a circuit diagram showing a configuration of the quantizer 95 of the A/D converter 9 constructed with a band pass ΔΣ modulator as shown in FIG. 9. As shown in the drawing, the quantizer 95 includes a voltage comparator constituted by an input switch In_SW1 for supplying an input signal V, a reference switch In_SW2 for supplying a reference voltage Vref, a sampling capacitor Cin, an operational amplifier opamp and a feedback switch Fd_SW. The input switch In_SW1 is activated by a positive-phase sampling signal Φs. The reference switch In_SW2 and the feedback switch Fd_SW are activated by a negative-phase sampling signal Φs. To an output of the voltage comparator, two-stage latch circuit including latches FL, RL1 and RL2 is connected through a switch Cp_SW. In the two-stage latch circuit, the latch FL in the preceding-stage latches an output signal of the voltage comparator in response to the negative-phase sampling signal /Φs. To an output of the preceding-stage latch FL of the two-stage latch circuit, inputs of the two subsequent-stage latches RL1 and RL2 in parallel are connected. As for the two latches RL1 and RL2 in the subsequent stage, one latch RL1 and the other latch RL2 alternately latch an output signal of the preceding-stage latch FL according to the interleave method in response to a positive-phase sampling signal Φs2 of a double frequency and a negative-phase sampling signal /Φs2 of a double frequency. Further, in response to the sampling signals Φs and /Φs, output signals of the two latches RL1 and RL2 of the subsequent stage of the quantizer 95 are supplied to the input of the input of the local D/A converter 96 alternately. This interleave operation enlarges the timing margin of the operations of the quantizer 95 and the local D/A converter 96.

While the invention made by the inventors has been described above based on the embodiments hereof specifically, the invention is not so limited. It is needless to say that various changes and modifications may be made without departing from the subject matter hereof.

Figure 11:
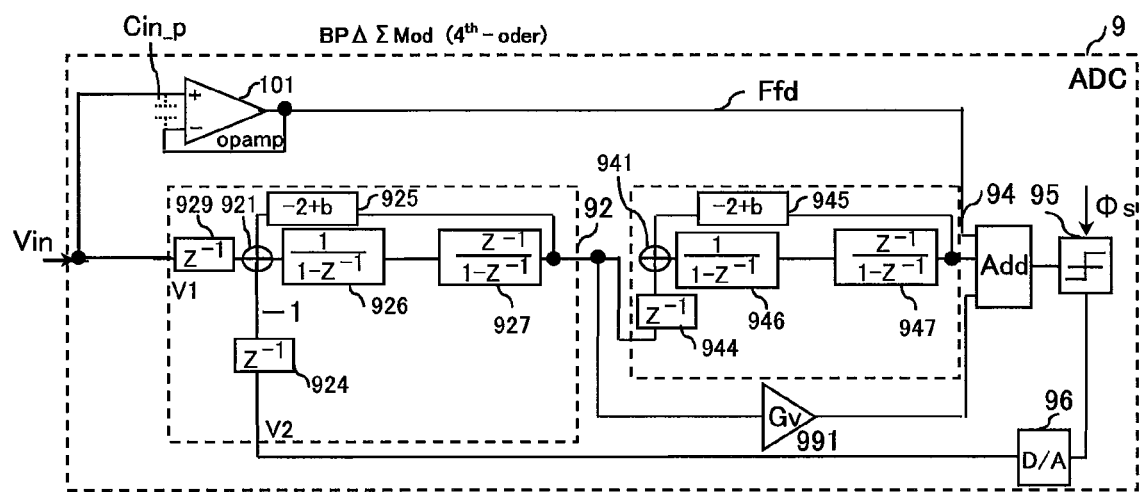
FIG. 11 is a diagram showing an A/D converter constructed with a band pass ΔΣ modulator according to another embodiment of the invention for the digital IF receiver incorporated in an AM/FM radio as shown in FIG. 1.

FIG. 11 is a diagram showing an A/D converter 9 constructed with a band pass ΔΣ modulator according to another embodiment of the invention for the digital IF receiver incorporated in an AM/FM radio as shown in FIG. 1. As in the drawing, a voltage follower 101 including an operational amplifier opamp is placed in the direct feedforward path Ffd. The analog input signal Vin is supplied to a non-inverting input terminal + of the operational amplifier opamp of the voltage follower 101. An output terminal of the operational amplifier opamp of the voltage follower 101 is connected to an inverting input terminal – thereof and also connected to an input of an adder Add. The operational amplifier opamp of the voltage follower 101 responds to the analog input signal Vin and activates an input to the adder Add with its high activation power. The input parasitic capacitance Cin_p between the non-inverting input terminal + and inverting input terminal – of the operational amplifier opamp of the voltage follower 101 is set to be small. Further, the output impedance of the operational amplifier opamp of the voltage follower 101 is small, and therefore the operational amplifier opamp of the voltage follower 101 can lower the level at which a spike noise component from the quantizer 95 is entered into the resonator 92.

Also, the influence of the spike noise can be reduced even if the voltage follower 101 used in the A/D converter 9 as shown in FIG. 11 is replaced with the signal delay units 103 and 104. However, a signal delay effect equivalent to the effect gained in the case where a signal delay circuit is arranged between the input of the adder Add and the input of the resonator 92 can be achieved by putting a delay circuit for a clock signal which decides the sampling timing of signal input to the adder Add and the sampling timing of input to the resonator 92.

The invention is not limited to the arrangement in which the two resonators 92 and 94 are connected in series. Three resonators may be connected in series, instead. In this case, an A/D converter constructed with a band pass ΔΣ modulator which has a sextuple delay instead of a quaternary delay on the whole is formed, and thus a larger quantization noise reduction effect can be achieved. Otherwise, one double-delay resonator may be adopted. In this case, an A/D converter constructed with a band pass ΔΣ modulator which has a binary delay instead of a quaternary delay on the whole is formed.

Further, except the applications to digital IF receivers incorporated in AM/FM radios and mobile phones, the invention is widely applicable to digital IF receivers incorporated in a wireless LAN and a Bluetooth, a ultra-wide band impulse radio (UWB-IR) and the like, and on-board equipment, household electrical appliances, and other equipment and devices which use other wireless communications, for example.

Still further, for example, in regard to the digital IF receiver as shown in FIG. 1, a portion of the circuit of the RF analog front-end RF_AFE can be integrated inside the chip of a digital signal processing large-scale integrated circuit LSI as a result of the increase in packing density. The resultant integrated chip will be useful for reducing the production cost of digital IF receivers incorporated in an AM/FM radio, a multimode and multiband mobile phone, a wireless LAN, a Bluetooth and a UWB-IR.

What is claimed is:

1. A semiconductor integrated circuit, comprising
an A/D converter constructed with a non-quadrature band pass ΔΣ modulator and converting an analog input signal into a digital output signal,
wherein the band pass ΔΣ modulator includes a resonator responding to the analog input signal to show a band-pass characteristic at a predetermined frequency and show an attenuation characteristic at a frequency different from the predetermined frequency,
a quantizer to which an output signal of the resonator is supplied, and
a local D/A converter to which an output signal of the quantizer is supplied,
the band pass ΔΣ modulator produces a signal of difference between the analog input signal and an output of a local analog signal of the local D/A converter, and supplies the resultant signal to the resonator, and
the band pass ΔΣ modulator further includes an adder for supplying the analog input signal to an input of the quantizer,
wherein the resonator, the quantizer and the local D/A converter operate in response to a sampling signal having a predetermined frequency, and
the predetermined frequency of the sampling signal is set so as to have an error from a quadruple of a highest frequency of the analog input signal.

2. The semiconductor integrated circuit of claim 1, wherein the resonator includes: one set selected from a set of delay circuits and a set of integration circuits, the circuits of the either set connected in series between an input and output of the resonator; and a feedback circuit connected between the output and input of the resonator.

3. A semiconductor integrated circuit, comprising
an A/D converter constructed with a non-quadrature band pass ΔΣ modulator and converting an analog input signal into a digital output signal,
wherein the band pass ΔΣ modulator includes a resonator responding to the analog input signal to show a bandpass characteristic at a predetermined frequency and show an attenuation characteristic at a frequency different from the predetermined frequency, a quantizer to which an output signal of the resonator is supplied, and a local D/A converter to which an output signal of the quantizer is supplied, the band pass ΔΣ modulator produces a signal of difference between the analog input signal and an output of a local analog signal of the local D/A converter, and supplies the resultant signal to the resonator, and the band pass ΔΣ modulator further includes an adder for supplying the analog input signal to an input of the quantizer, wherein at least one of the delay circuits of the resonator is arranged according to a double-sampling architecture, and includes two sampling capacitors and switches of two routes controlled by sampling switch signals which are half the predetermined frequency of the sampling signal and opposite in phase.

4. A semiconductor integrated circuit, comprising an A/D converter constructed with a band pass ΔΣ modulator and converting an analog input signal into a digital output signal, wherein the band pass ΔΣ modulator includes a resonator responding to the analog input signal to show a band-pass characteristic at a predetermined frequency and show an attenuation characteristic at a frequency different from the predetermined frequency, a quantizer to which an output signal of the resonator is supplied, and a local D/A converter to which an output signal of the quantizer is supplied, the band pass ΔΣ modulator produces a signal of difference between the analog input signal and an output of a local analog signal of the local D/A converter, and supplies the resultant signal to the resonator, and the band pass ΔΣ modulator further includes an adder for supplying the analog input signal to an input of the quantizer, and the band pass ΔΣ modulator further includes a signal transmission circuit supplying the analog input signal to an input of the adder, and reducing influence of spike noise of the quantizer on the input to the resonator between the input of the adder and an input of the resonator, wherein the resonator, the quantizer and the local D/A converter operate in response to a sampling signal having a predetermined frequency, and the predetermined frequency of the sampling signal is set so as to have an error from a quadruple of a highest frequency of the analog input signal.

5. A semiconductor integrated circuit, comprising an A/D converter constructed with a band pass ΔΣ modulator and converting an analog input signal into a digital output signal, wherein the band pass ΔΣ modulator includes a resonator responding to the analog input signal to show a band-pass characteristic at a predetermined frequency and show an attenuation characteristic at a frequency different from the predetermined frequency, a quantizer to which an output signal of the resonator is supplied, and a local D/A converter to which an output signal of the quantizer is supplied, the band pass ΔΣ modulator produces a signal of difference between the analog input signal and an output of a local analog signal of the local D/A converter, and supplies the resultant signal to the resonator, and the band pass ΔΣ modulator further includes an adder for supplying the analog input signal to an input of the quantizer, and the band pass ΔΣ modulator further includes a signal transmission circuit supplying the analog input signal to an input of the adder, and reducing influence of spike noise of the quantizer on the input to the resonator between the input of the adder and an input of the resonator, wherein the resonator includes: one set selected from a set of delay circuits and a set of integration circuits, the circuits of the either set connected in series between an input and output of the resonator; and a feedback circuit connected between the output and input of the resonator.

6. A semiconductor integrated circuit, comprising an A/D converter constructed with a band pass ΔΣ modulator and converting an analog input signal into a digital output signal, wherein the band pass ΔΣ modulator includes a resonator responding to the analog input signal to show a band-pass characteristic at a predetermined frequency and show an attenuation characteristic at a frequency different from the predetermined frequency, a quantizer to which an output signal of the resonator is supplied, and a local D/A converter to which an output signal of the quantizer is supplied, the band pass ΔΣ modulator produces a signal of difference between the analog input signal and an output of a local analog signal of the local D/A converter, and supplies the resultant signal to the resonator, and the band pass ΔΣ modulator further includes an adder for supplying the analog input signal to an input of the quantizer, and the band pass ΔΣ modulator further includes a signal transmission circuit supplying the analog input signal to an input of the adder, and reducing influence of spike noise of the quantizer on the input to the resonator between the input of the adder and an input of the resonator, wherein at least one circuit of one set selected from a set of delay circuits and a set of integration circuits of the resonator is arranged according to a double-sampling architecture, and includes two sampling capacitors and switches of two routes controlled by sampling switch signals which are half the predetermined frequency of the sampling signal and opposite in phase.

7. A semiconductor integrated circuit comprising, in its semiconductor chip:

an RF analog front-end;

an A/D converter; and a digital signal processing unit, wherein the RF analog front-end includes a low-noise amplifier, an RF local signal oscillator and a receiving mixer, the A/D converter is constructed with a non-quadrature band pass ΔΣ modulator converting an analog input signal into a digital output signal, the low-noise amplifier amplifies an RF received signal received through an antenna, the resultant RF amplified signal of the low-noise amplifier is supplied to one input of the receiving mixer, an RF local signal from the RF local signal oscillator is supplied to the other input of the receiving mixer, the receiving mixer mixes the RF amplified output signal and the RF local signal, a first intermediate frequency signal is produced by first down-conversion from an output of the receiving mixer, when the first intermediate frequency signal is supplied to the A/D converter constructed with the band pass ΔΣ modulator, the A/D converter executes analog-to-digital conversion of the first intermediate frequency from an analog signal to a digital signal, the band pass ΔΣ modulator includes a resonator which responds to the analog input signal to show a band-pass characteristic at a predetermined frequency, and show an attenuation characteristic at other frequency different from the predetermined frequency, a quantizer to which an output signal of the resonator is supplied, and a local D/A converter to which an output signal of the quantizer is supplied, the band pass ΔΣ modulator produces a signal of difference between the analog input signal and an output of a local analog signal from the local D/A converter and supplied the resultant signal to the resonator, and the band pass ΔΣ modulator further includes an adder for supplying the analog input signal to an input of the quantizer.

8. The semiconductor integrated circuit of claim 7, wherein RF amplified signals having frequency bands are converted in frequency into the first intermediate frequency signals of a common frequency by the first down conversion in the receiving mixer.

9. The semiconductor integrated circuit of claim 8, wherein the RF amplified signals consist of RF received signals for FM radios and RF received signals for AM radios.

10. The semiconductor integrated circuit of claim 8, wherein the RF amplified signals consist of at least two kinds of RF received signals selected from RF received signals of GSM850, GSM900, DCS1800, PCS1900 and WCDMA.

11. The semiconductor integrated circuit of claim 7, wherein the resonator, the quantizer and the local D/A converter operate in response to a sampling signal having a predetermined frequency, and the predetermined frequency of the sampling signal is set so as to have an error from a quadruple of a highest frequency of the analog input signal.

12. The semiconductor integrated circuit of claim 11, wherein the resonator includes: one set selected from a set of delay circuits and a set of integration circuits, the circuits of the either set connected in series between an input and output of the resonator; and a feedback circuit connected between the output and input of the resonator.

13. The semiconductor integrated circuit of claim 12, wherein at least one circuit of one set selected from a set of delay circuits and a set of integration circuits of the resonator is arranged according to a double-sampling architecture, and includes two sampling capacitors and switches of two routes controlled by sampling switch signals which are half the predetermined frequency of the sampling signal and opposite in phase.

14. The semiconductor integrated circuit of claim 12, wherein the non-quadrature band pass ΔΣ modulator converts the analog input signal which is a single analog input signal into the digital output signal which is a single digital output signal.

15. A semiconductor integrated circuit comprising, in its semiconductor chip:
an RF analog front-end;
an A/D converter; and
a digital signal processing unit, wherein the RF analog front-end includes a low-noise amplifier, an RF local signal oscillator and a receiving mixer, the A/D converter is constructed with a band pass ΔΣ modulator converting an analog input signal into a digital output signal, the low-noise amplifier amplifies an RF received signal received through an antenna, the resultant RF amplified signal of the low-noise amplifier is supplied to one input of the receiving mixer, an RF local signal from the RF local signal oscillator is supplied to the other input of the receiving mixer, the receiving mixer mixes the RF amplified output signal and the RF local signal, a first intermediate frequency signal is produced by first down-conversion from an output of the receiving mixer, when the first intermediate frequency signal is supplied to the A/D converter constructed with the band pass ΔΣ modulator, the A/D converter executes analog-to-digital conversion of the first intermediate frequency from an analog signal to a digital signal, the band pass ΔΣ modulator includes a resonator which responds to the analog input signal to show a band-pass characteristic at a predetermined frequency, and show an attenuation characteristic at other frequency different from the predetermined frequency, a quantizer to which an output signal of the resonator is supplied, and a local D/A converter to which an output signal of the quantizer is supplied, the band pass ΔΣ modulator produces a signal of difference between the analog input signal and an output of a local analog signal from the local D/A converter and supplied the resultant signal to the resonator, the band pass ΔΣ modulator further includes an adder for supplying the analog input signal to an input of the quantizer, and the band pass ΔΣ modulator further includes a signal transmission circuit supplying the analog input signal to an input of the adder, and reducing influence of spike noise of the quantizer on the input to the resonator between the input of the adder and an input of the resonator.

16. The semiconductor integrated circuit of claim 15, wherein RF amplified signals having frequency bands are converted in frequency into the first intermediate frequency signals of a common frequency by the first down conversion in the receiving mixer.

17. The semiconductor integrated circuit of claim 16, wherein the RF amplified signals consist of RF received signals for FM radios and RF received signals for AM radios.

18. The semiconductor integrated circuit of claim 16, wherein the RF amplified signals consist of at least two kinds of RF received signals selected from RF received signals of GSM850, GSM900, DCS1800, PCS1900 and WCDMA.

19. The semiconductor integrated circuit of claim 15, wherein the signal transmission circuit is composed of any one selected from a combination of low-pass filters, a voltage follower and a combination of signal delay circuits.

20. The semiconductor integrated circuit of claim 15, further comprising a delay circuit provided for a clock signal which decides sampling timings at the input of the adder and the input of the resonator.

21. The semiconductor integrated circuit of claim 15, wherein the resonator, the quantizer and the local D/A converter operate in response to a sampling signal having a predetermined frequency, and the predetermined frequency of the sampling signal is set so as to have an error from a quadruple of a highest frequency of the analog input signal.

22. The semiconductor integrated circuit of claim 21, wherein the resonator includes: one set selected from a set of delay circuits and a set of integration circuits, the circuits of the either set connected in series between an input and output of the resonator; and a feedback circuit connected between the output and input of the resonator.

23. The semiconductor integrated circuit of claim 15, wherein at least one of the delay circuits of the resonator is arranged according to a double-sampling architecture, and includes two sampling capacitors and switches of two routes controlled by sampling switch signals which are half the predetermined frequency of the sampling signal and opposite in phase.

* * * * *